Figure 1:
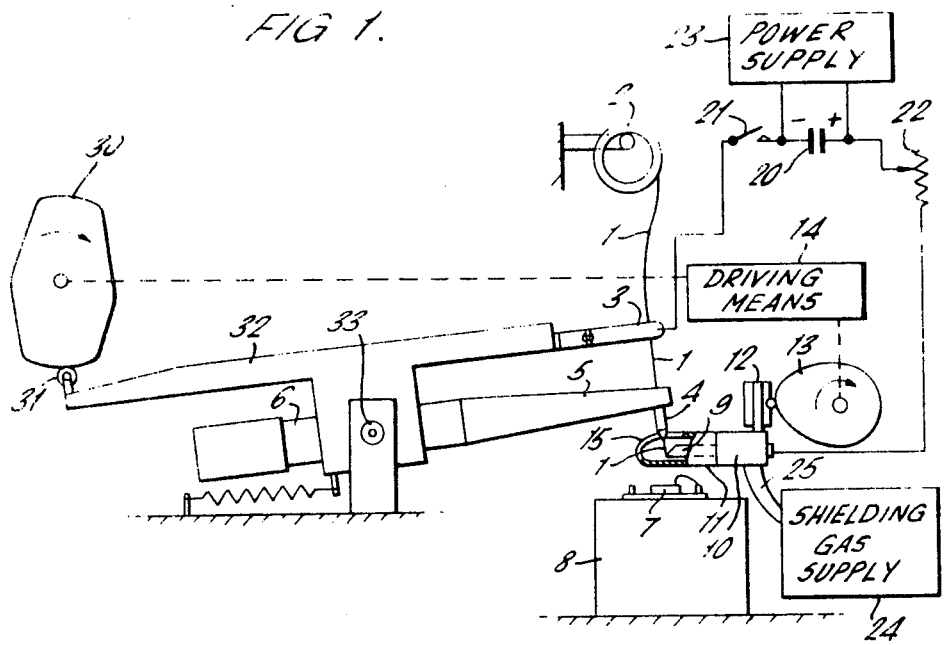

United States Patent [19]

Edson et al.

[11] 4,098,447
[45] Jul. 4, 1978

[54] BONDING METHOD AND APPARATUS

[75] Inventors: Donald A. Edson; Keith I. Johnson; Michael H. Scott, all of Cambridge, England

[73] Assignee: The Welding Institute, England

[21] Appl. No.: 686,410

[22] Filed: May 14, 1976

[30] Foreign Application Priority Data

May 15, 1975 [GB] United Kingdom ............... 20701/75

[51] Int. Cl.$^2$ .................... B23K 37/04; H01L 21/60
[52] U.S. Cl. ...................................... 228/4.5; 219/68; 219/86.1; 228/111; 219/76.13
[58] Field of Search ................ 228/4.5, 110, 111, 179; 219/68, 86, 78

[56] References Cited

U.S. PATENT DOCUMENTS

| 2,679,570 | 5/1954 | Cisne | 228/4.5 X |
| 3,934,108 | 1/1976 | Howard | 228/4.5 X |
| 3,950,631 | 4/1976 | Schmidt et al. | 228/4.5 X |

FOREIGN PATENT DOCUMENTS 2,453,112  11/1975  Fed. Rep. of Germany ........ 228/4.5

OTHER PUBLICATIONS

Baker and Bryan, "An Improved Form of Thermocompression Bond," British Journal Applied Physics, 1965, vol. 16, pp. 865–868.

Primary Examiner—Donald G. Kelly
Assistant Examiner—K. J. Ramsey
Attorney, Agent, or Firm—Kemon & Estabrook

[57] ABSTRACT

Difficulties in forming a ball on the end of a wire of aluminium or aluminium alloy for ball bonding are overcome by applying between the wire and an electrode a low voltage, typically 30 volts, and bringing the wire and electrode into temporary contact to fuse the wire and initiate a spark discharge which results in the formation of a ball on the wire end. The spark discharge takes place in a shielding gas to avoid oxidation of the ball.

4 Claims, 2 Drawing Figures

BONDING METHOD AND APPARATUS

This invention is concerned with the electrical interconnection of small components or circuits and is expected to find a particular application to the connection of integrated silicon circuit chips to substrate circuits.

Integrated silicon circuit chips are currently connected to substrate circuits by aluminium wires of, for example, 25 μm diameter, or by gold wires. In one technique, a wedge-shaped ultrasonic tool is used to connect the aluminium or gold wires to the pads on the silicon chip or to the pads on the substrate circuit.

In another known technique, a ball is formed on the end of a gold wire and the gold ball is then connected to the silicon chip or substrate circuit by thermocompression or ultrasonic bonding. The ball may be formed by applying a hydrogen flame to the wire, or by creating a spark discharge between the wire and an electrode. The spark discharge is formed by applying a sufficient voltage (350 volts or over) between the gold wire and another electrode to cause a discharge to take place in the space between them.

Ball bonding has a number of advantages over bonding using wedge tools. Furthermore a mono-metallic aluminium joint between the aluminium pads and the wires would be desirable becaue it would eliminate the possibility of brittle inter-metallic compounds, leading to increased reliability, as well as because of economic considerations. Nevertheless, until now it has been considered impracticable to apply the ball bonding technique to aluminium because of the oxide layer which forms naturally and very rapidly on an exposed surface of aluminium and which prevents the formation of a satisfactory ball when the wire is subjected to a flame; such a technique results in heavily oxidised aluminium balls of very variable shape. Thus, in the British Journal of Applied Physics, 1965, Vol. 16, Pages 865 to 868, it was reported by D. Baker and I. E. Bryan in an article entitled "An improved form of thermocompression bond" that an unsuccessful attempt had been made to develop a method of ball bonding aluminium wires; among the heat sources tried were a focused laser beam, a microplasma torch, capacitor discharge and a miniature radiant heater. They found however that the surface oxide film was sufficient to oppose the surface tension forces tending to form the required spherical end, even when heating was carried out in a protective atmosphere.

We have discovered that it is possible to practise ball bonding with wires of aluminium or aluminium alloy.

The present invention is concerned with a method and apparatus for connecting a wire to a component or terminal by forming a ball on the wire by spark discharge and thereafter positioning the ball on and bonding it to the component or terminal; in a method according to the invention, the wire is of aluminium or aluminium alloy and a spark discharge is formed by applying between the wire and an electrode a voltage not greater than 200 volts and by bringing the wire and the electrode into contemporary contact to fuse the wire end and form the spark discharge while supplying shielding gas to the region of the spark discharge, and thereby to create a ball on the wire end under the protection of the shielding gas for bonding to the component or terminal.

Although by the use of a voltage of less than 200 volts and the contact method of spark initiation, a ball is formed on an aluminium wire end with the wire of either polarity, we have found that it is greatly to be preferred to make the wire of negative polarity with respect to the electrode. Our investigations have shown that with the wire positive the balls formed are not consistently symmetrical about the wire axis and are of less regular shape than when the wire is negative. It will be appreciated that such symmetry and regularity are highly desirable for connections to micro-circuits.

Preferably, the voltage applied between the wire end and the electrode is less than 50 volts. It will be appreciated that a voltage of 200 volts or less is insufficient to cause a spark to jump across an air gap. The initiation of a spark across an air gap is the method used for capacitor-discharge ball-bonding with gold wire, the voltage used in this case being generally of the order of 460 volts.

However, using a 460 volt power source, commercially available for the ball bonding of gold wire, it was found that without a shielding gas oxidised balls were formed on an aluminium wire and that with argon, nitrogen and helium as shielding gases, a glow discharge took place, without the formation of a ball. In carbon dioxide there was a slight spark but again no ball was formed. Surprisingly, when the lower voltage is applied between the wire and electrode and the discharge is started by the touch breakdown method, a spark discharge takes place with the formation of a ball which, in the presence of the shielding gas, is not oxidised. In this way, balls of good dimensional consistency can be formed in a reproducible manner and with the wire connected as cathode, the balls formed are substantially symmetrical about the wire axis.

Figure 2:
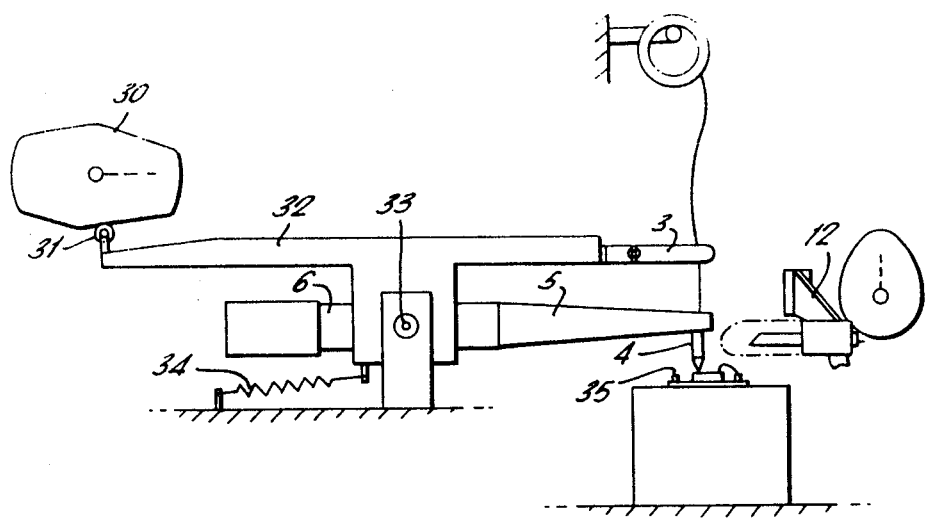

FIG. 1 illustrates apparatus suitable for forming a ball on a wire of aluminium or aluminium alloy and for bonding the wire to a micro-circuit, the apparatus being shown in position for forming the ball; and FIG. 2 shows the apparatus of FIG. 1 in position for bonding the ball to a work piece.

In the drawings, a wire 1 extends from a reel 2 through a conductive clamp 3 and a capillary nozzle 4 formed on the end of the horn 5 of an ultrasonic welding tool 6. The wire tip extending from the capillary nozzle 4 is to be welded to a micro-circuit 7 located on a receiving base 8.

To form a ball on the end of the wire, a spark discharge is created between the tip of the wire 1 and an electrode 9. The electrode 9 is supported in a holder 10 formed with a transparent forward portion 11 (shown in section in the drawing) and is mounted on the end of a pivoted arm 12 (see also FIG. 2). A cam 13 rotated by means of a driving means 14 pivots the arm 12 to advance the electrode to the position shown in FIG. 1 for ball formation, and then permits the arm 12 to retract to the position shown in FIG. 2 for bonding. The transparent forward portion of the electrode holder 10 is formed with a slot 15 to permit the nozzle tip and wire to pass into the electrode holder as it is advanced.

A capacitor 20 is connected in series with a switch 21 and a variable resistance 22, between the conductive clamp 3 and the end of the electrode 9. The capacitor is charged by means of a power supply 23. A shielding gas supply 24 is connected through a tube 25 to the interior of the electrode holder. Shielding gas flows along the electrode and wire tip and out through the slot 15.

With the switch 21 in its closed position, the electrode advanced to its position shown in FIG. 1, and the shielding gas flowing through the electrode holder, contact is made between the wire and the electrode and a current passes. This fuses the wire tip, breaking the contact and causing a spark discharge to take place between the wire and electrode with the formation of a ball on the end of the wire.

As the cam 13 continues to rotate, the electrode is withdrawn to the position shown in FIG. 2.

The driving means 14 also drives a cam 30. The cam 30 acts through a follower 31 to pivot an arm 32, on the end of which the conductive clamp 3 is mounted, about an axis 33. The ultra-sonic transducer assembly 6 also pivots about the axis 33. In the position shown in FIG. 1, the cam 30 has pivoted the arm 32 and transducer assembly 6 to raise the conductive clamp 3 and the capillary nozzle 4 above the work piece to permit formation of the ball. In the position shown in FIG. 2, the cam 30 has rotated to allow the conductive clamp 3 and capillary nozzle 4 to pivot downwards to bring the ball into contact with the micro-circuit. A spring 34 controls the bonding force. The ultra-sonic transducer 6 is then energised and acts through the ultra-sonic horn 5 to vibrate the nozzle 4 and therewith the ball on the end of the wire against the micro-circuit, to form an ultra-sonic bond in a known manner.

When the wire has been joined to the micro-circuit in the manner described above, it can be connected to a lead-out terminal 35. The manner of connecting the wire to the terminal 35 forms no part of the present invention; in practice, wedge bonding can be used because the bonding area available is larger. For the connection to the micro-circuit, the bonding area available is small and the amount of energy required to make the bond is more critical. If desired, the capillary nozzle 4 can be used to make the wedge bond to the lead-out terminal in known manner.

In this example, we have illustrated ultra-sonic bonding of the wire to the micro-circuit and this is the form of bonding which we prefer. However, it is also possible to connect the ball formed on the end of the wire of aluminium, or aluminium alloy, to the micro-circuit by thermo-compression bonding.

As an example, we have found that balls of good quality can be formed on 75 μm Al wire at voltages from 20v to 45 v with respective capacitance values of 600 and 50 μFd. The preferred voltage for wire of this diameter was 30v with a capacitance value between 80 – 150 μFd, and a resistance of 0.5 ohms in the circuit. The peak arc current was approximately 6 amps. Under these conditions, a run of 500 balls was made using a carbon electrode. These showed good dimensional consistency without gross oxidation and were symmetrical about the extension of the wire axis.

We have found that it is better to use a friable electrode, for example an electrode of carbon, than to use an electrode such as tungsten. It appears that with a carbon electrode less aluminium is picked up on the electrode during ball formation than when tungsten is used.

I claim:

1. Apparatus for connecting a wire of aluminium or aluminium alloy to a component or terminal, comprising a wire holder including means for gripping the wire, means for receiving the component or terminal to which the wire is to be bonded, and ball-forming means, the ball-forming means comprising:
   a reusable electrode;
   means supporting said reusable electrode within a slotted housing;
   a supply circuit for applying between the wire and the electrode a voltage not exceeding 200 volts;
   driving means for effecting relative movement of the wire and electrode by displacing the slotted housing to permit temporary contact between the wire and the electrode through the slot, whereby a spark discharge is produced when said temporary contact is broken;
   a shielding gas inlet and means for conveying shielding gas from the inlet to the neighborhood of the wire end during the spark discharge;
   the apparatus further comprising means for effecting relative movement of the wire, on which a ball has been formed by the spark discharge process, and a component or terminal received in the apparatus to bring the ball into contact with the component or terminal for bonding.

2. Apparatus for connecting a wire of aluminium or aluminium alloy to a component or terminal, comprising a wire holder including means for gripping the wire, means for receiving the component or terminal to which the wire is to be bonded, the wire holder being mounted for movement towards and away from the receiving means, and ball-forming means, the ball-forming means comprising:
   an electrode arranged for movement towards and away from a wire in the wire holder and a supply circuit connected between the electrode and wire;
   a common driving means arranged for moving the electrode towards the wire to initiate a spark discharge between a tip of the electrode and the wire and thereafter moving the electrode away from the wire and moving the wire towards the component or terminal;
   a housing within which said electrode is accommodated and which is movable with the electrode, said housing having an open end adjacent said electrode tip; and
   means for conveying shielding gas to the interior of said movable housing and thereby to the neighborhood of the wire end during said spark discharge.

3. Apparatus for connecting a wire of aluminum or aluminum alloy to a component or terminal, comprising a wire holder including means for gripping the wire, means for receiving the component or terminal to which the wire is to be bonded, and ball-forming means, the ball-forming means comprising:
   an open ended housing;
   a reusable electrode mounted within said housing with the tip of said electrode adjacent said open end;
   a supply circuit for applying between the wire and a tip of said reusable electrode a voltage not exceeding 200 volts;
   driving means operative to advance said electrode and housing towards the wire and to withdraw said electrode and electrode housing from the wire to cause temporary contact between the wire and the electrode tip adjacent said open end of said housing whereby spark discharge is produced when said temporary contact is broken;
   means for conveying shielding gas to the interior of said housing and thereby to the neighborhood of the wire end during said spark discharge;
   the apparatus further comprising means for effecting relative movement of the wire, on which a ball has been formed by the spark discharge process, and a component or terminal received in the apparatus, to bring the ball into contact with the component or terminal for bonding following withdrawal of said housing and electrode from the wire.

4. Apparatus in accordance with claim 1, in which the means for effecting relative movement of the wire and electrode displaces the said housing with the electrode along a path transverse to the direction of extension of the wire from the wire holder, and in which the end of the electrode which contacts the wire is sloped.

* * * * *